(12) United States Patent
Yang et al.

(10) Patent No.: US 8,053,038 B2
(45) Date of Patent: Nov. 8, 2011

(54) METHOD FOR MAKING TITANIUM-BASED COMPOUND FILM OF POLY SILICON SOLAR CELL

(75) Inventors: Tsun-Neng Yang, Taipei (TW);
Shan-Ming Lan, Taoyuan County (TW);
Chin-Chen Chiang, Taoyuan County (TW); Wei-Yang Ma, Banqiao (TW);
Chien-Te Ku, Pingzhen (TW);
Yu-Hsiang Huang, Pingzhen (TW)

(73) Assignee: Atomic Energy Council-Institute of Nuclear Energy Research, Lungtan, Taoyuan (TW)

( * ) Notice: Subject to any disclaimer, the term of this patent is extended or adjusted under 35 U.S.C. 154(b) by 0 days.

(21) Appl. No.: 11/902,076

(22) Filed: Sep. 18, 2007

(65) Prior Publication Data
US 2010/0291322 A1 Nov. 18, 2010

(51) Int. Cl.
*C23C 14/30* (2006.01)

(52) U.S. Cl. ........ 427/596; 427/597; 427/115; 427/124; 427/578; 427/255.27; 427/255.7

(58) Field of Classification Search .................. 427/115, 427/123, 124, 250, 255.391, 255.7, 596, 427/597, 578, 255.27
See application file for complete search history.

(56) References Cited

U.S. PATENT DOCUMENTS

| | | | | |
|---|---|---|---|---|
| 3,961,997 A * | 6/1976 | Chu | ................................. | 438/97 |
| 4,696,834 A * | 9/1987 | Varaprath | ................ | 427/249.19 |
| 7,851,249 B2 * | 12/2010 | Yang et al. | ...................... | 438/57 |
| 7,863,080 B1 * | 1/2011 | Yang et al. | ...................... | 438/73 |
| 2003/0214043 A1 * | 11/2003 | Saitoh et al. | ................... | 257/758 |
| 2008/0032497 A1 * | 2/2008 | Yang et al. | ..................... | 438/622 |
| 2008/0105298 A1 * | 5/2008 | Lu et al. | ......................... | 136/256 |
| 2008/0121280 A1 * | 5/2008 | Carnel et al. | .................. | 136/258 |

FOREIGN PATENT DOCUMENTS

| DE | 19842004 A1 * | 3/2000 |
|---|---|---|
| JP | 2005286067 A * | 10/2005 |

OTHER PUBLICATIONS

Beaucarne, G., et al., "Thin-film polysilicon solar cells on foreign substrates using direct thermal CVD: material and solar cell design." Thin Solid Films 403-404 (2002) pp. 229-237.*
Ornaghi, C., et al., "Thin film polycrystalline silicon solar cell on ceramics with a seeding layer formed via aluminum-induced crystallisation of amorphous silicon." IEE Proc.-Circuits Devices Syst., vol. 150, No. 4, Aug. 2003, pp. 287-292.*
Gordon, I., et al., "8% Efficient Thin-Film Polycrystalline-Silicon Solar Cells Based on Aluminum-Induced Crystallization and Thermal Cvd". Prog. Photovolt: Res. Appl. 2007; 15:575-586.*

* cited by examiner

*Primary Examiner* — Bret Chen
(74) *Attorney, Agent, or Firm* — Jackson IPG PLLC; Demian K. Jackson

(57) ABSTRACT

A method is disclosed for making a titanium-based compound film of a poly-silicon solar cell. In the method, a ceramic substrate is made of aluminum oxide. The ceramic substrate is coated with a titanium film in an e-gun evaporation system. Dichlorosilane is provided on the titanium film by atmospheric pressure chemical vapor deposition. A titanium-based compound film is formed on the ceramic substrate.

12 Claims, 18 Drawing Sheets

METHOD FOR MAKING TITANIUM-BASED COMPOUND FILM OF POLY SILICON SOLAR CELL

BACKGROUND OF INVENTION

1. Field of Invention

The present invention relates to a method for making an inexpensive poly-silicon solar cell and, more particularly, to a method for making a titanium-based compound film of a poly-silicon solar cell and, more particularly, to a method for making a titanium-based compound film on a ceramic substrate in a high-temperature process based on chemical vapor deposition ("CVD").

2. Related Prior Art

Most silicon-based solar cells are made in low-temperature processes based on plasma-enhanced chemical vapor deposition ("PECVD"). An amorphous-silicon or microcrystalline-silicon film is coated on a glass, aluminum, silicon, stainless steel or plastic substrate. A back contact is made of aluminum, gold, silver or transparent conductive oxide such as indium-tin oxide ("ITO") and zinc oxide.

The primary advantage of the low-temperature processes is the wide variety of materials that can be used to make the substrates. However, they suffer drawbacks such as defective silicon films, low photoelectrical conversion efficiencies and low light-soaking stability.

In the PECVD, while coating the microcrystalline silicon film, a silicon material is highly diluted in hydrogen. For example, $[H_2]/[SiH_4]>15$. That is, the concentration or flow rate of $H_2$ is more than 15 times as high as that of $SiH_4$. The problems with the PECVD are a low growth rate of the film, a long process and a high cost.

Regarding the making of the poly-silicon solar cells, there are various techniques such as solid phase crystallization ("SPC") and aluminum-induced crystallization ("AIC"). The SPC is based on the PECVD. An amorphous silicon film is deposited, intensively heated and annealed at a high temperature. Thus, a poly-silicon film with a grain size of 1 to 2 micrometers is made.

In the AIC as shown in FIGS. 14 through 18, an aluminum film 92 is coated on a substrate 91. An amorphous silicon film 93 is coated on the aluminum film 92 based on the PECVD and annealed at a temperature of about 575 degrees Celsius for a long time to form a seeding layer 94. Then, it is subjected to an epitaxial process such as the PECVD or an electron cyclotron resonance chemical deposition ("ECR-CVD") to make a poly-silicon film 95. The AIC however involves many steps and takes a long time. The resultant grain size is about 0.1 to 10 micrometers.

As discussed above, regarding the conventional methods for making poly-silicon film solar cells in the low-temperature processes based on the PECVD, there are many defects in the silicon films, the photoelectrical conversion efficiencies are low, the light soaking stabilities low, the growth rates of the films low, the processes long, and the costs high. Concerning the method for making poly-silicon film solar cells based on the AIC, the processes are long for including many steps and therefore expensive.

The present invention is therefore intended to obviate or at least alleviate the problems encountered in prior art.

SUMMARY OF INVENTION

It is an objective of the present invention to provide a method for making a titanium-based compound film on a ceramic substrate based on a high-temperature process and CVD.

It is another objective of the present invention to provide a method for making a $TiSi_2$, TiN, TiC, $TiB_2$ or $TiC_xN_y$ compound film on a ceramic substrate based on a high-temperature process and CVD.

To achieve the foregoing objective of the present invention, the method includes the step of making a ceramic substrate of aluminum oxide, the step of coating the ceramic substrate with a titanium film in an e-gun evaporation system, the step of providing dichlorosilane on the titanium film by atmospheric pressure chemical vapor deposition and the step of forming a titanium-based compound film on the ceramic substrate.

Alternatively, the method includes the step of providing a ceramic substrate of aluminum oxide, the step of providing a titanium film and an amorphous-silicon film on the ceramic substrate, the step of providing a heating device to heat the amorphous-silicon film and the step of forming a titanium-based compound film on the ceramic substrate.

Alternatively, the method includes the steps of providing a ceramic substrate of aluminum oxide and forming a titanium-based compound film on the ceramic substrate by reacting dichlorosilane with titanium tetrachloride by atmospheric-pressure chemical vapor deposition.

Other objectives, advantages and features of the present invention will become apparent from the following description referring to the attached drawings.

BRIEF DESCRIPTION OF DRAWINGS

The present invention will be described via the detailed illustration of embodiments in view of prior art referring to the drawings.

DETAILED DESCRIPTION OF PREFERRED EMBODIMENT

Referring to FIGS. 1 through 5, there is shown a method for making a titanium-based compound film on a ceramic substrate based in a high-temperature process based on CVD according to a first embodiment of the present invention.

Figure 1:
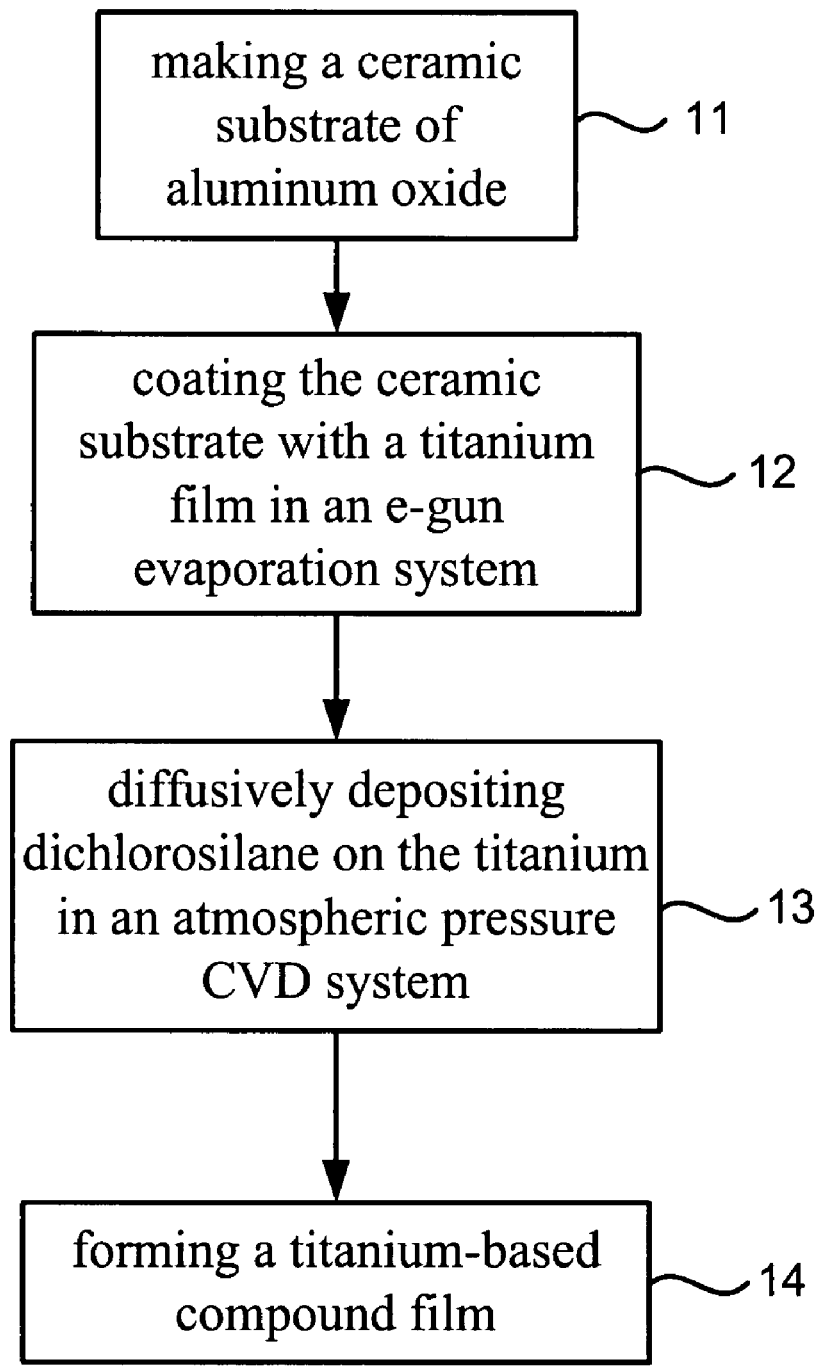
FIG. 1 is a flowchart of a method for making a titanium-based compound film on a ceramic substrate in a high-temperature process based on CVD according to a first embodiment of the present invention.
Figure 2:
FIG. 2 is a side view of a ceramic substrate used in the method shown in FIG. 1.

Referring to FIGS. 1 and 2, at 11, a ceramic substrate 21 is provided. The ceramic substrate 21 is made of aluminum oxide ("$Al_2O_3$"). The thickness of the ceramic substrate 21 is 0.1 to 1.0 mm.

Figure 3:
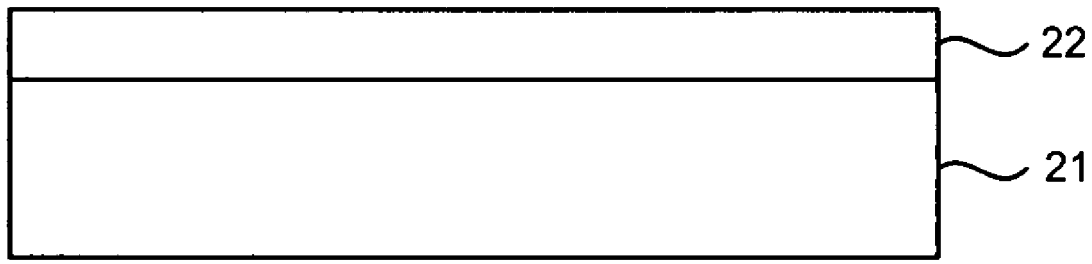
FIG. 3 is a side view of a titanium film coated on the ceramic substrate shown in FIG. 2.

Referring to FIGS. 1 and 3, at 12, in an e-gun evaporation system, at a temperature of 250 degrees Celsius, the ceramic substrate 21 is coated with a titanium film 22. The thickness of the titanium film 22 is 500 to 5000 angstroms.

Figure 4:
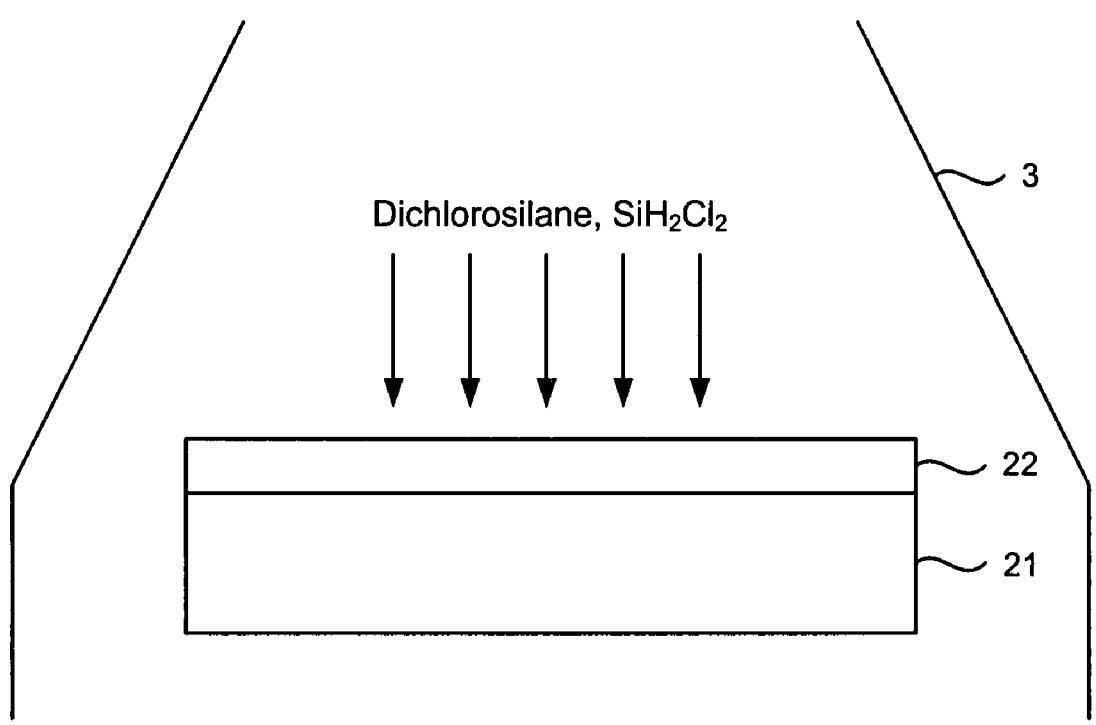
FIG. 4 is a side view of an APCVD device for providing dichlorosilane on the titanium film shown in FIG. 3.

Referring to FIGS. 1 and 4, at 13, in an atmospheric pressure CVD system 3, dichlorosilane ("$SiH_2Cl_2$") is diffusively deposited on the titanium film 22 at a temperature of 800 to 1100 degrees Celsius for 1 to 15 minutes. Thus, some of the silicon atoms in the dichlorosilane exchange with some of the titanium atoms in the titanium layer 22.

Figure 5:
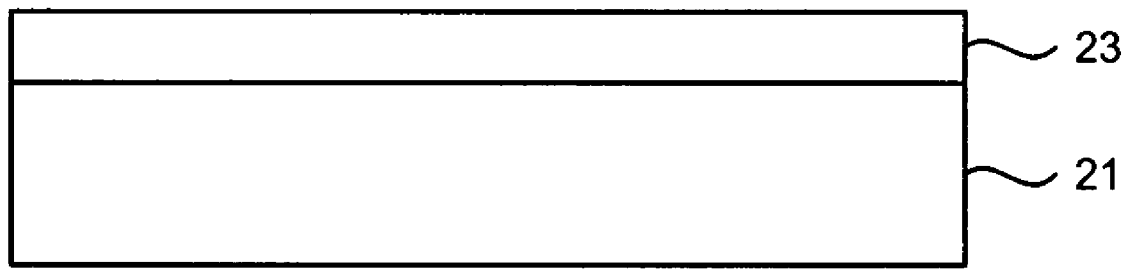
FIG. 5 is a side view of a titanium-based compound film coated on the ceramic substrate shown in FIG. 2.

Referring to FIGS. 1 and 5, at 14, a titanium-silicon layer 23 is coated on the ceramic substrate 21. The sheet resistance of the titanium-silicon film 23 is lower than 0.5 $\Omega/cm^2$ like that of ordinary metal.

Referring to FIGS. 6 through 10, there is shown a method for making a titanium-based compound film on a ceramic substrate in a high-temperature process based on CVD according to a second embodiment of the present invention.

Figure 6:
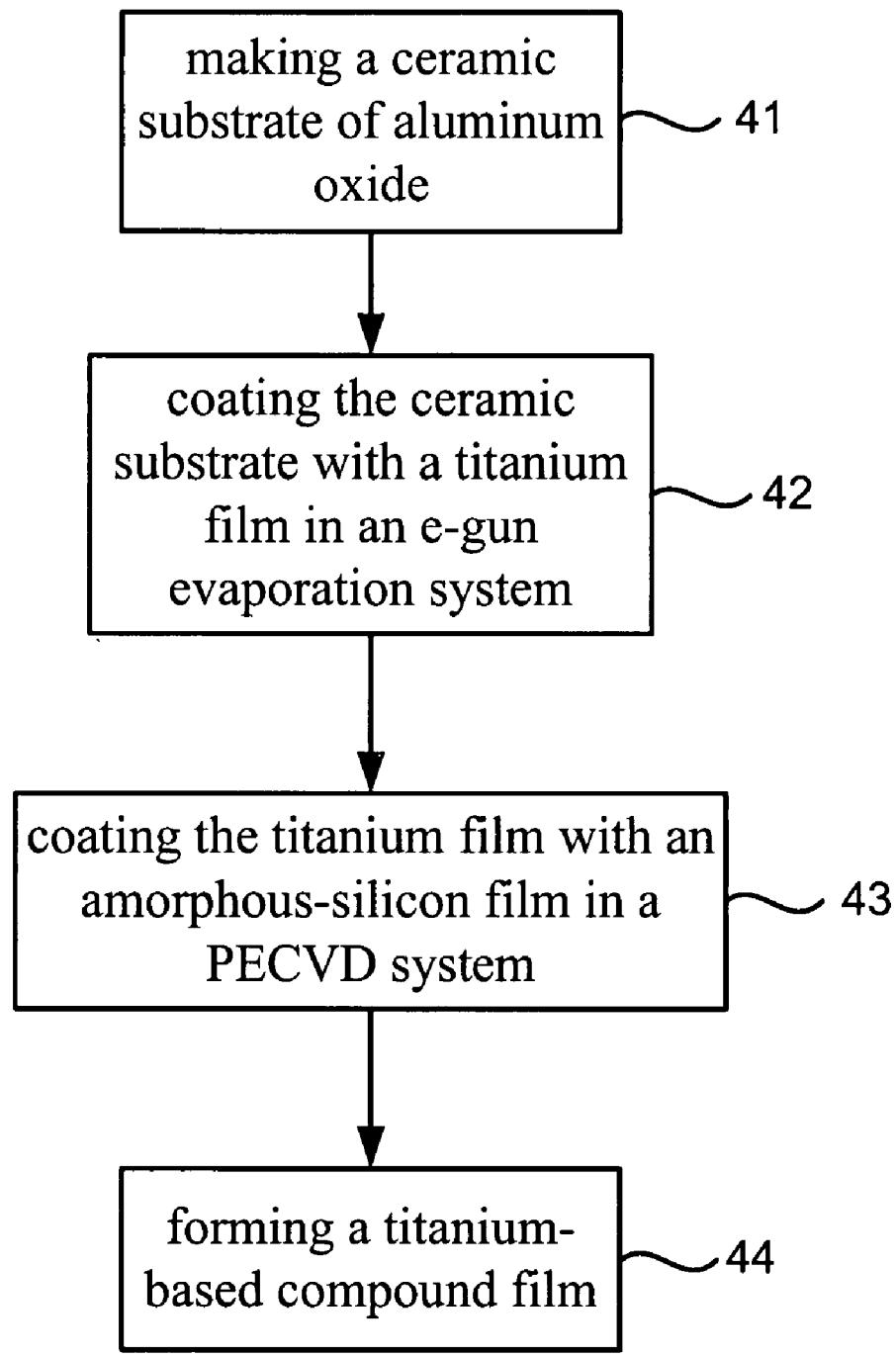
FIG. 6 is a flowchart of a method for making a titanium-based compound film on a ceramic substrate in a high-temperature process based on CVD according to a second embodiment of the present invention.
Figure 7:
FIG. 7 is a side view of a ceramic substrate used in the method shown in FIG. 6.

Referring to FIGS. 6 and 7, at 41, a ceramic substrate 51 is provided. The ceramic substrate 51 is made of aluminum oxide. The thickness of the ceramic substrate 51 is 0.1 to 1.0 mm.

Figure 8:
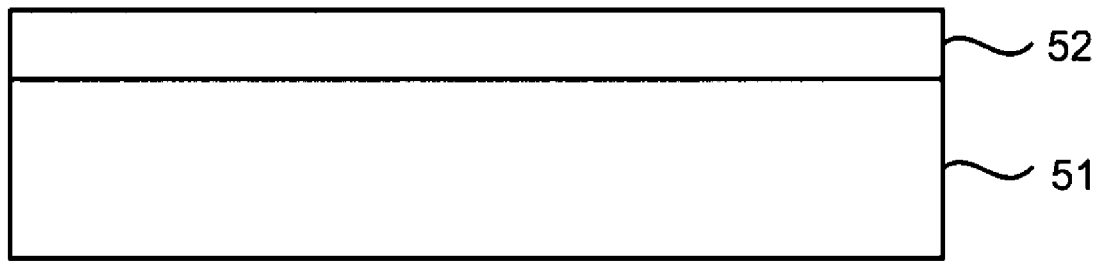
FIG. 8 is a side view of a titanium film coated on the ceramic substrate shown in FIG. 7.

Referring to FIGS. 6 and 8, at 42, in an e-gun evaporation system, at a temperature of 250 degrees Celsius, the ceramic substrate 51 is coated with a titanium film 52. The thickness of the titanium film 52 is 500 to 5000 angstroms.

Figure 9:
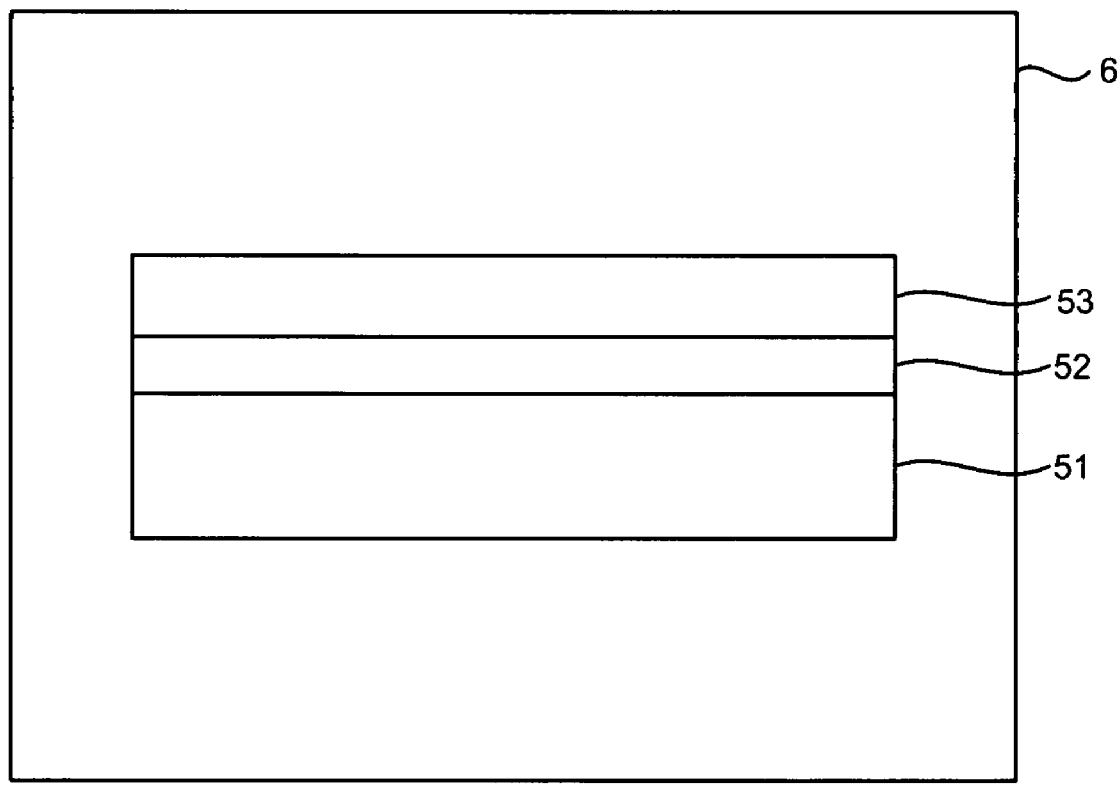
FIG. 9 is a side view of an amorphous silicon film coated on the titanium film shown in FIG. 8.

Referring to FIGS. 6 and 9, at 43, in a PECVD system, the titanium film 52 is coated with an amorphous-silicon film 53. The ratio of the thickness of the amorphous-silicon film 53 to that of the titanium film 52 is about 2:1. In a heating device 6, the amorphous-silicon film 53 is annealed at a temperature of 700 to 800 degrees Celsius so that some of the silicon atoms in the amorphous-silicon film 53 exchange with some of the titanium atoms in the titanium layer 52. The heating device 6 is preferably a high-temperature annealing furnace.

Alternatively, the ceramic substrate 51 may be coated with the amorphous-silicon film 53. Then, the amorphous-silicon film 53 is coated with the titanium film 52 in the e-gun evaporation system.

Figure 10:
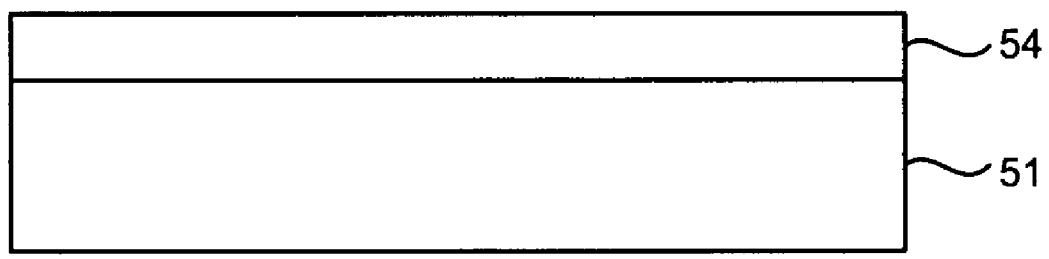
FIG. 10 is a side view of a titanium-based compound film coated on the ceramic substrate shown in FIG. 7.

Referring to FIGS. 6 and 10, a titanium-silicon compound film 54 is coated on the ceramic substrate 51. The sheet resistance of the titanium-silicon film 54 is lower than 0.5 $\Omega/cm^2$ like that of ordinary metal.

Figure 11:
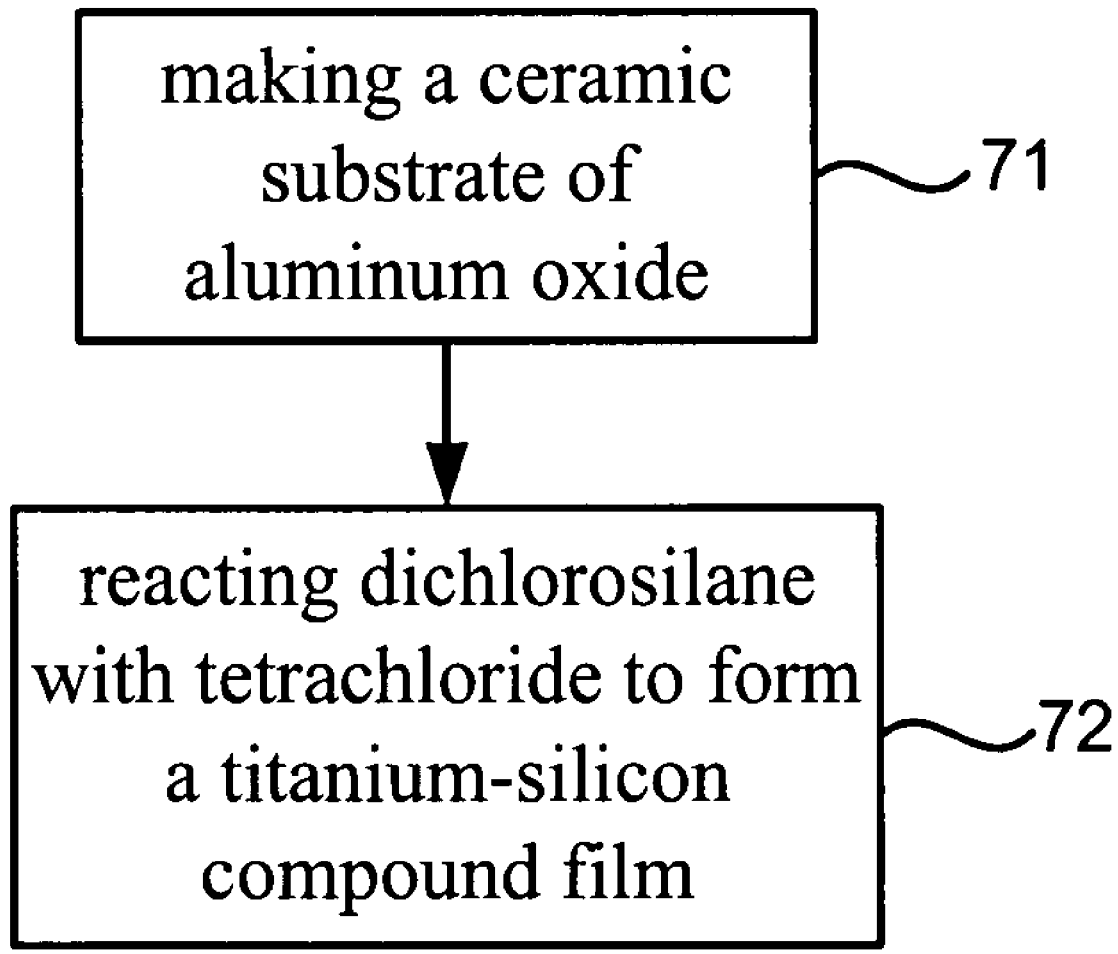
FIG. 11 is a flowchart of a method for making a titanium-based compound film on a ceramic substrate in a high-temperature process based on CVD according to a third embodiment of the present invention.
Figure 12:
FIG. 12 is a side view of a ceramic substrate used in the method shown in FIG. 11.
Figure 13:
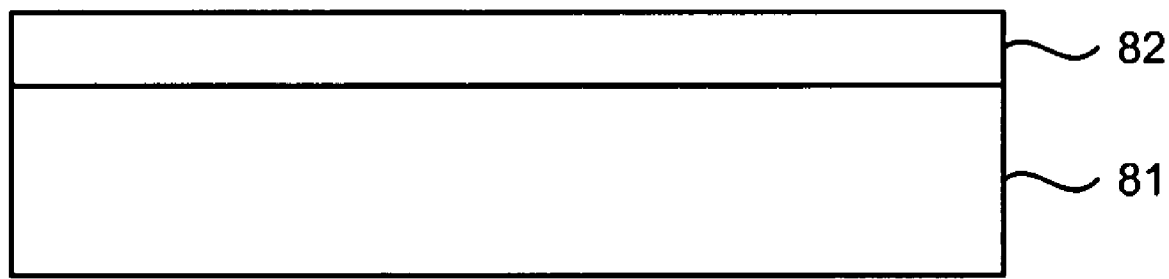
FIG. 13 is a side view of a titanium film coated on the ceramic substrate shown in FIG. 12.
Figure 14:
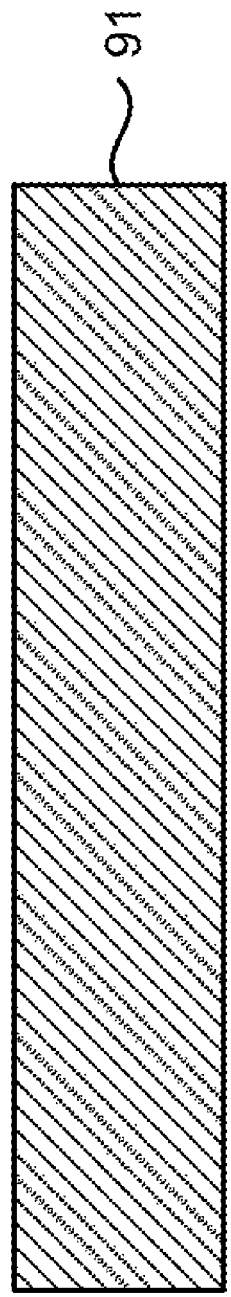
FIG. 14 is a side view of a substrate used in a conventional method for making a poly-silicon film on a substrate in a low-temperature process.
Figure 15:
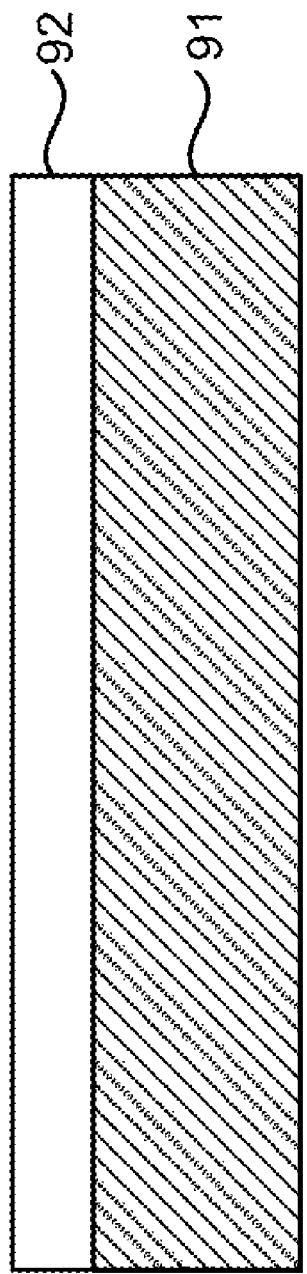
FIG. 15 is a side view of an aluminum film coated on the substrate shown in FIG. 14.
Figure 16:
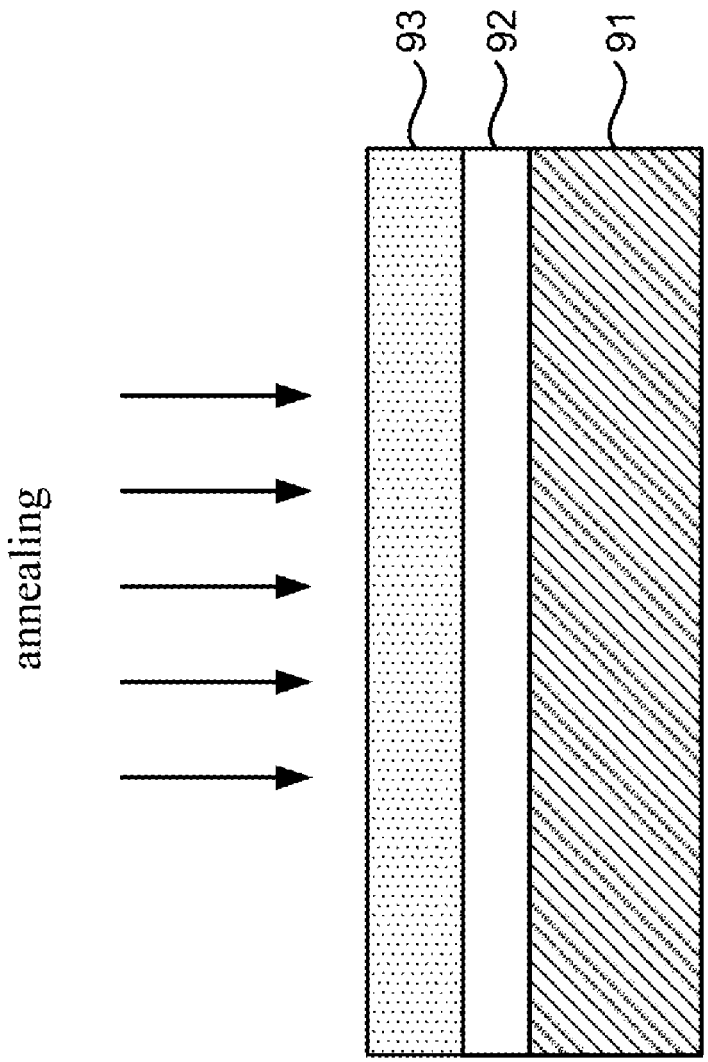
FIG. 16 is a side view of an amorphous silicon film coated on the aluminum film shown in FIG. 15.
Figure 17:
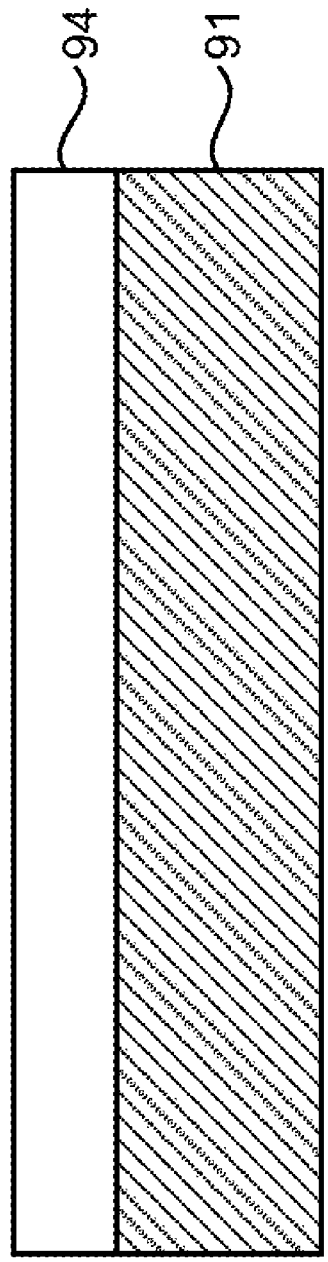
FIG. 17 is a side view of a seeding layer made of the amorphous silicon film and the aluminum film shown in FIG. 16.
Figure 18:
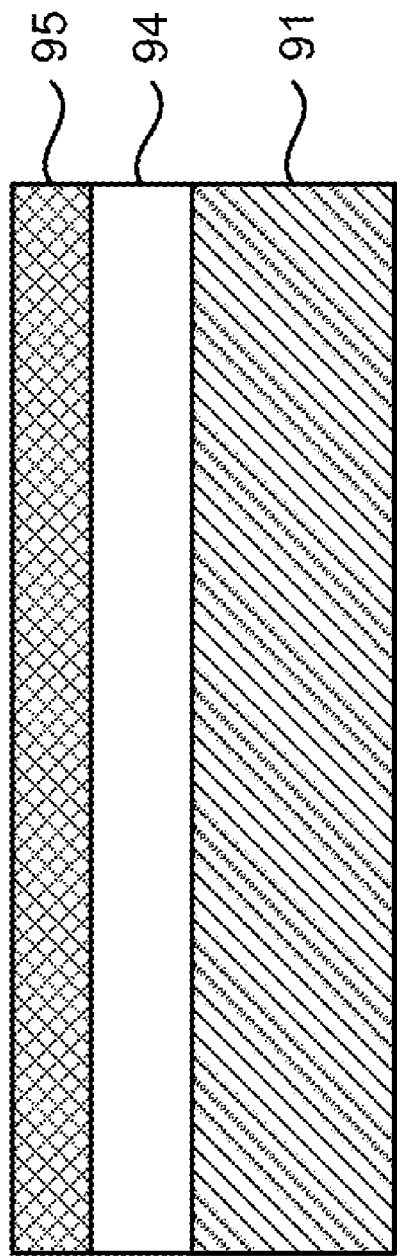
FIG. 18 is a side view of a poly-silicon film coated on the seeding layer shown in FIG. 17.

Referring to FIGS. 11 through 13, there is shown a method for making a titanium-based compound film on a ceramic substrate in a high-temperature process based on CVD according to a second embodiment of the present invention.

Referring to FIGS. 11 and 12, at 71, a ceramic substrate 51 is provided. The ceramic substrate 81 is made of aluminum oxide. The thickness of the ceramic substrate 81 is 0.1 to 1.0 mm.

Referring to FIGS. 11 and 13, at 72, in an atmospheric pressure CVD system, dichlorosilane and titanium tetrachloride ("$TiCl_4$") react with each other and turn into a titanium-silicon compound film 82 on the ceramic substrate 81. The sheet resistance of the titanium-silicon film 82 is lower than 0.5 $\Omega/cm^2$ like that of ordinary metal.

According to the present invention, not only the inexpensive, refractory and chemically stable ceramic substrate can be integrated with constructing materials, but also the inexpensive, environmentally friend and abundant titanium-based compound film is used as the back contact of the poly-silicon solar cell. The titanium-based compound film is electrically conductive. Moreover, the thermal expansion coefficient of the titanium-based compound film matches that of the ceramic substrate. The titanium-based compound film is used as a poly-silicon seeding layer. Furthermore, the high-temperature process and the CVD causes a high epi-growth rate and an excellent crystalline quality and effectively reduces the cost of equipment and simplifies the process.

The present invention has been described via the detailed illustration of the preferred embodiment. Those skilled in the art can derive variations from the preferred embodiment without departing from the scope of the present invention. Therefore, the preferred embodiment shall not limit the scope of the present invention defined in the claims.

The invention claimed is:

1. A method for making a titanium-silicon compound film of a poly-silicon solar cell, the method comprising the steps of:

making a ceramic substrate of aluminum oxide;

coating the ceramic substrate with a titanium film in an e-gun evaporation system at a temperature of 250 Celsius; and providing dichlorosilane on the titanium film by atmospheric pressure chemical vapor deposition at a temperature of 800 to 1100 Celsius such that some of the silicon atoms in the dichlorosilane exchange with some of the atoms in the titanium film thereby forming a conductive back contact and poly-silicon seeding layer of the solar cell comprising a titanium-silicon compound film on the ceramic substrate.

2. The method according to claim 1, wherein the sheet resistance of the titanium-silicon compound film is lower than 0.5 $\Omega/cm^2$.

3. The method according to claim 1, wherein the thickness of the ceramic substrate is 0.1 to 1.0 mm.

4. The method according to claim 1, wherein the thickness of the titanium film is 500 to 5000 angstroms.

5. A method for making a titanium-silicon compound film of a poly-silicon solar cell, the method comprising the steps of:

providing a ceramic substrate of aluminum oxide;

providing a titanium film in an e-gun evaporation system at a temperature of 250 Celsius on the ceramic substrate;

providing an amorphous-silicon film in a plasma-enhanced chemical vapor deposition system on the ceramic substrate; and providing a heating device to anneal the amorphous-silicon film at a temperature of 700 to 800 Celsius such that some of the silicon atoms in the amorphous-silicon film exchange with some of the atoms in the titanium film thereby; forming a conductive back contact and polysilicon seeding layer of the solar cell comprising a titanium-silicon compound film on the ceramic substrate.

6. The method according to claim 5, wherein the sheet resistance of the titanium-silicon compound film is lower than 0.5 $\Omega/cm^2$.

7. The method according to claim 5 wherein the step of providing the titanium and amorphous-silicon films on the ceramic substrate comprises the steps of:

coating the ceramic substrate with the titanium film in an e-gun evaporation system; and then coating the titanium film with the amorphous-silicon film.

8. The method according to claim 5 wherein the step of providing the titanium and amorphous-silicon films on the ceramic substrate comprises the steps of:

coating the ceramic substrate with the amorphous-silicon film; and then coating the amorphous-silicon film with the titanium film in an e-gun evaporation system.

9. The method according to claim 5, wherein the thickness of the ceramic substrate is 0.1 to 1.0 mm.

10. The method according to claim 5, wherein the thickness of the titanium film is 500 to 5000 angstroms.

11. The method according to claim 5, wherein the ratio of the thickness of the amorphous-silicon film to that of the titanium film is 2:1.

12. The method according to claim 5, wherein the heating device is an annealing furnace.

* * * * *